United States Patent
Venezia et al.

(10) Patent No.: US 8,492,865 B2
(45) Date of Patent: Jul. 23, 2013

(54) IMAGE SENSOR WITH CONTACT DUMMY PIXELS

(75) Inventors: Vincent Venezia, Los Gatos, CA (US); Duli Mao, Sunnyvale, CA (US); Hsin-Chih Tai, San Jose, CA (US); Yin Qian, Milpitas, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 348 days.

(21) Appl. No.: 12/848,628

(22) Filed: Aug. 2, 2010

(65) Prior Publication Data

US 2011/0068429 A1 Mar. 24, 2011

Related U.S. Application Data

(60) Provisional application No. 61/245,609, filed on Sep. 24, 2009.

(51) Int. Cl.
*H01L 27/146* (2006.01)
*H01L 31/02* (2006.01)

(52) U.S. Cl.
USPC .... 257/443; 257/441; 257/291; 257/E27.133; 257/E27.13

(58) Field of Classification Search
CPC .............. H01L 27/14643; H01L 27/1463
USPC ............ 257/443, 441, 291, E27.133, E27.13
See application file for complete search history.

(56) References Cited

U.S. PATENT DOCUMENTS

| 7,863,661 B2* | 1/2011 | Katsuno et al. ............... 257/292 |
| 2007/0063234 A1 | 3/2007 | Itonaga |
| 2009/0294816 A1* | 12/2009 | Park et al. ..................... 257/292 |

* cited by examiner

*Primary Examiner* — Matthew Reames
*Assistant Examiner* — Benjamin Tzu-Hung Liu
(74) *Attorney, Agent, or Firm* — Blakely Sokoloff Taylor & Zafman LLP

(57) ABSTRACT

An image sensor array includes a substrate layer, a metal layer, an epitaxial layer, a plurality of imaging pixels, and a contact dummy pixel. The metal layer is disposed above the substrate layer. The epitaxial layer is disposed between the substrate layer and the metal layer. The imaging pixels are disposed within the epitaxial layer and each include a photosensitive element for collecting an image signal. The contact dummy pixel is dispose within the epitaxial layer and includes an electrical conducting path through the epitaxial layer. The electrical conducting path couples to the metal layer above the epitaxial layer.

17 Claims, 4 Drawing Sheets

IMAGE SENSOR WITH CONTACT DUMMY PIXELS

CROSS-REFERENCE TO RELATED APPLICATIONS

This application claims the benefit of U.S. Provisional Application No. 61/245,609 filed on Sep. 24, 2009, the contents of which are incorporated herein by reference.

TECHNICAL FIELD

This disclosure relates generally to image sensors, and in particular but not exclusively, relates to back-side illuminated image sensors.

BACKGROUND INFORMATION

In standard CMOS image sensors (CIS), such as front-side illuminated devices, the CIS and controlling circuitry are formed on the surface of a p-type doped epitaxial ("epi") silicon layer formed on a p-type doped silicon substrate, which is typically highly p-type doped and has relatively low resistance. Back-side illuminated (BSI) CMOS image sensors however have the majority of the underlying silicon removed, which increases the substrate resistance across the array. Performance problems associated with increased substrate resistance are therefore more problematic in BSI devices. Other thin substrate devices such as those fabricated on Silicon On Insulator (SOI) substrates or those incorporating buried collector layers may also have similar problems. One method of solving this problem is to create a substrate contact in each imaging pixel. Such a solution involves additional well and contact doping implants, as well as additional metal contacts and metal routing in each pixel. For very large pixel structures (i.e. larger than 4 μm) the additional layers and metal routing may not be a concern. However for smaller, more advance device structures, this solution reduces the photodiode fill factor, which degrades many of its performance parameters such as sensitivity and full well capacity. A technique that provides adequate pixel grounding across the pixel array in larger arrays with smaller pixels is desirable to prevent performance problems in BSI devices.

BRIEF DESCRIPTION OF DRAWINGS

Non-limiting and non-exhaustive embodiments of the invention are described with reference to the following figures, wherein like reference numerals refer to like parts throughout the various views unless otherwise specified. It is noted that, for purposes of illustrative clarity, certain elements in the drawings may not be drawn to scale.

DETAILED DESCRIPTION

Embodiments of an apparatus and method of fabrication of an image sensor array having improved performance characteristics are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
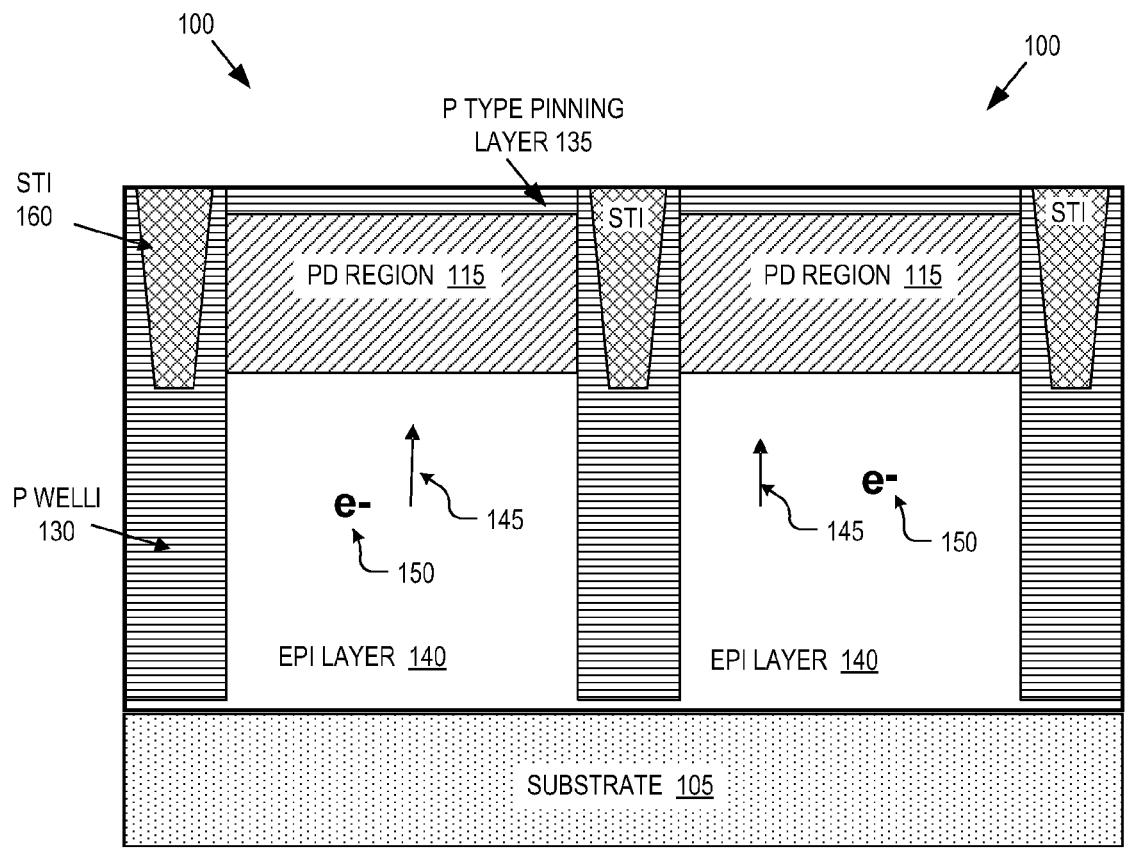
FIG. 1 is a cross sectional view of two neighboring CMOS image sensor pixels.

FIG. 1 illustrates two neighboring CMOS image sensors (CIS) pixels 100 formed within a p-type doped epi layer 140 disposed over a p-type doped silicon substrate 105. When a photo-generated charge carrier is formed shallow within pixel 100 (e.g., charge carrier 150), it experiences a strong upward attractive force (shown by the arrows 145) towards a photosensor or photodiode ("PD") region 115, due to a depletion region or P-N junction between PD region 115 and the underlying p-type doped epi layer 140. In the illustrated embodiment, a p-type doped pinning layer 135 overlays PD regions 115 to passivate their surfaces. CIS pixels 100 are separated by Shallow Trench Isolation (STI) regions 160 which are disposed within p-type doped wells 130. CIS pixels 100 includes pixel circuitry (not shown) disposed adjacent to PD region 115 within a P doped well (not shown). Such pixel circuitry provides a variety of functionality for regular operation of CIS pixel 100. For example, such pixel circuitry may include circuitry to commence acquisition of an image charge within PD region 115, to reset the image charge accumulated within PD region 115, to ready CIS pixel 100 for the next image, or to transfer out the image data acquired by CIS pixel 100. When substrate 105 is made very thin such as in the case of a Back Side Illuminated (BSI) CIS, and when the number of pixels is made very large, the lateral electrical resistance within substrate 105 may become relatively large and reduce performance of the pixel array.

Figure 2:
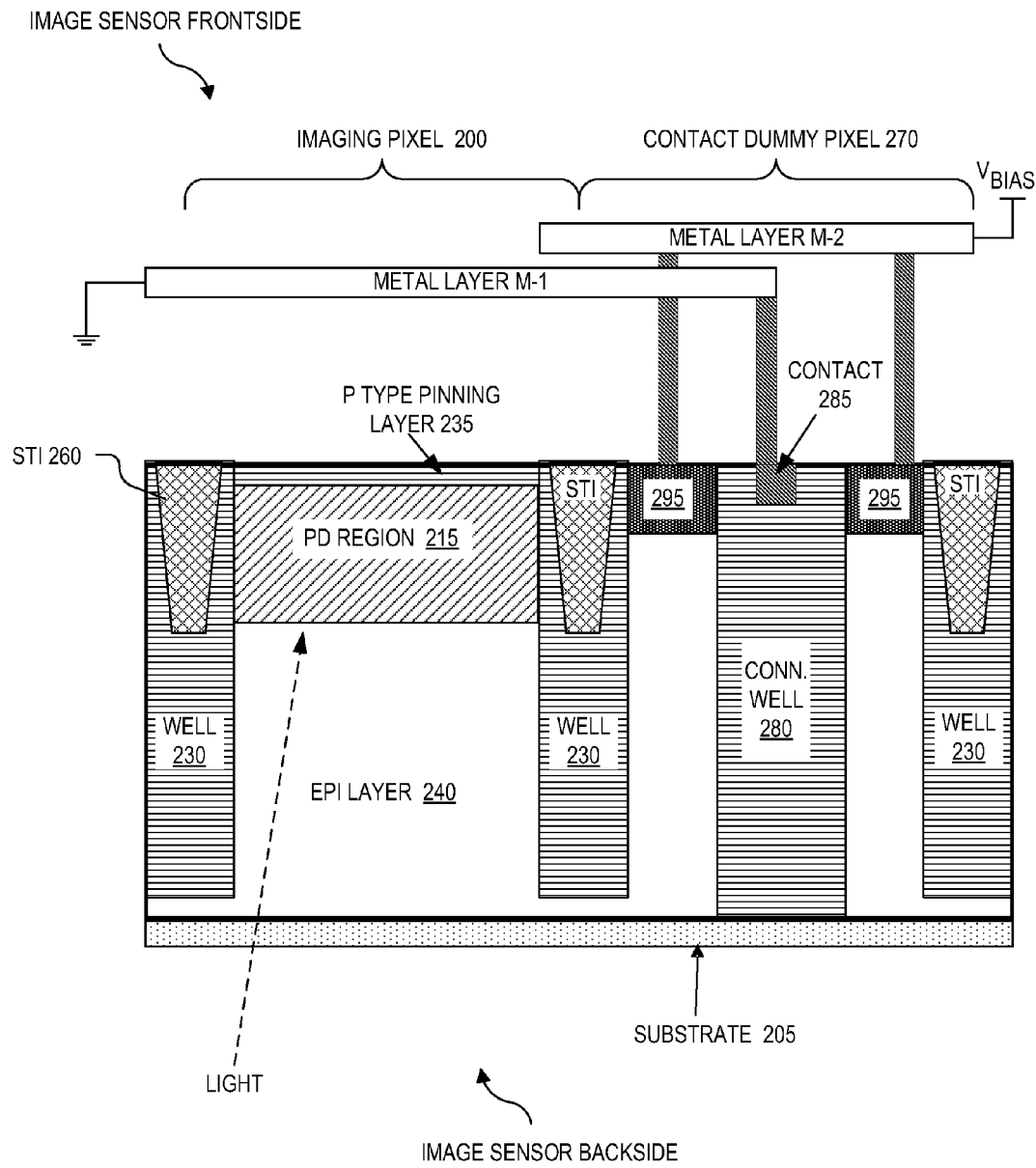
FIG. 2 is a cross sectional view of an imaging pixel neighboring a contact dummy pixel, in accordance with an embodiment of the invention.

FIG. 2 is a cross sectional view of a portion of a BSI CIS including two neighboring pixels: an imaging pixel 200 and a contact dummy pixel 270, in accordance with an embodiment of the invention. The illustrated embodiment of pixels 200 and 270 include a thinned substrate 205, a p-type doped epi layer 240, and PD region 215. Pixels 200 and 270 are formed into an array with other pixels 200 and 270 that are not shown. The photo-sensitive or PD regions 215 of each imaging pixel 200 are isolated from each other and from contact dummy pixels 270 with shallow trench isolations ("STI") 260 and dopant wells 230 (e.g., P-wells). In the illustrated embodiment, a p-type doped pinning layer 235 overlays PD regions 215 to passivate their surfaces.

Contact dummy pixel 270 is different from imaging pixel 200 in that it contains a doped connecting well 280 for making electrical contact to substrate 205. Contact dummy pixels 270 will in general not have a PD region 215 and will not be available for image collection. Instead doped connecting well 280 is located in the area normally reserved for PD regions 215 and extends down to substrate 205. Doped connecting well 280 is doped to have the same conductivity type as substrate 205 (e.g., p-type). Additionally, a p-type doped contact 285 (e.g., same as logic P source/drain) may be included within doped connecting well 280 to form an electrical contact to metal layer M-1. In one embodiment, metal layer M-1 is coupled to circuit ground and provides frontside grounding contact to substrate 205 via doped connecting well 280. Additional metal contacts and routing are not shown since these layers are layout dependent. In one embodiment, metal layer M-1 may be coupled to a plurality of contact dummy pixels 280 dispersed throughout a pixel array to provide multiple grounding points to substrate 205 thereby reducing its lateral resistance. Thus, doped connecting wells 280 acts as an electrical conducting path connecting metal layer M-1 to substrate 205 through epitaxial layer 240. While FIG. 2 illustrates doped connecting well 280 being coupled to metal layer M-1, in other embodiments, it may be coupled to any of the metal layers disposed over the frontside of the image sensor.

One advantage of this approach is that the individual PD region fill factor (the ratio of the PD region area to the entire pixel area) of imaging pixels 200 remains unchanged, so the performance of each pixel is unchanged. All of the layers in contact dummy pixel 270 (p-well implant, p-contact, metal 1 contact, etc) are already present in a standard CIS fabrication process. The number of such contact dummy pixels 270 is small in comparison to the total number of pixels in a pixel array, for example, there may be one per every 1000 imaging pixels 200. Placement as well as number of contact dummy pixels 270 depends on parameters such as the final substrate resistance (final silicon thickness), the physical size of the array, and the number of pixels. The total array sensing area is not significantly reduced by the total number of these "dummy" pixels. They will not significantly impact the total active pixel count. In addition, already established and applied methods of averaging out white or dead pixels in any CIS device will also remove the impact of the contact-dummy pixels from the final image. Therefore the final image will not significantly be altered by contact dummy pixels 270.

FIG. 2 also shows an embodiment in which an electron collector 290 is incorporated into contact dummy pixel 270. Photo-electron hole pairs may form in contact dummy pixels 270 and may interfere with image collection in adjacent imaging pixels 200. The holes can drain out of the p-type wells, which are typically grounded, but the photo-electrons may not be drained out of the dummy pixels. The embodiment of FIG. 2 illustrates contact dummy pixels 270 with an additional n-type contact 295. This contact is formed with a n-type implant and a contact to metal layer M-2 (or any other metal layer). The n-type implant can be the standard CMOS logic N+ source/drain implant, and may also include the n-type photo-diode implants to increase the depth of this electron collection region (not shown). This n-type electron collector can be biased with a bias voltage $V_{BIAS}>0$ (such as VDD) coupled via metal layer M-2.

In one embodiment, dopant wells 230 are p-type doped wells for isolating adjacent PD regions 215 and for preventing direct interface between STI 260 and PD regions 215. However, it should be appreciated that the conductivity types of all the elements can be swapped such that substrate 205 is n-type doped, epi layer 240 is n-type doped, PD regions 215 are p-type doped, and dopant wells 230 and 280 are n-type doped.

Figure 3:
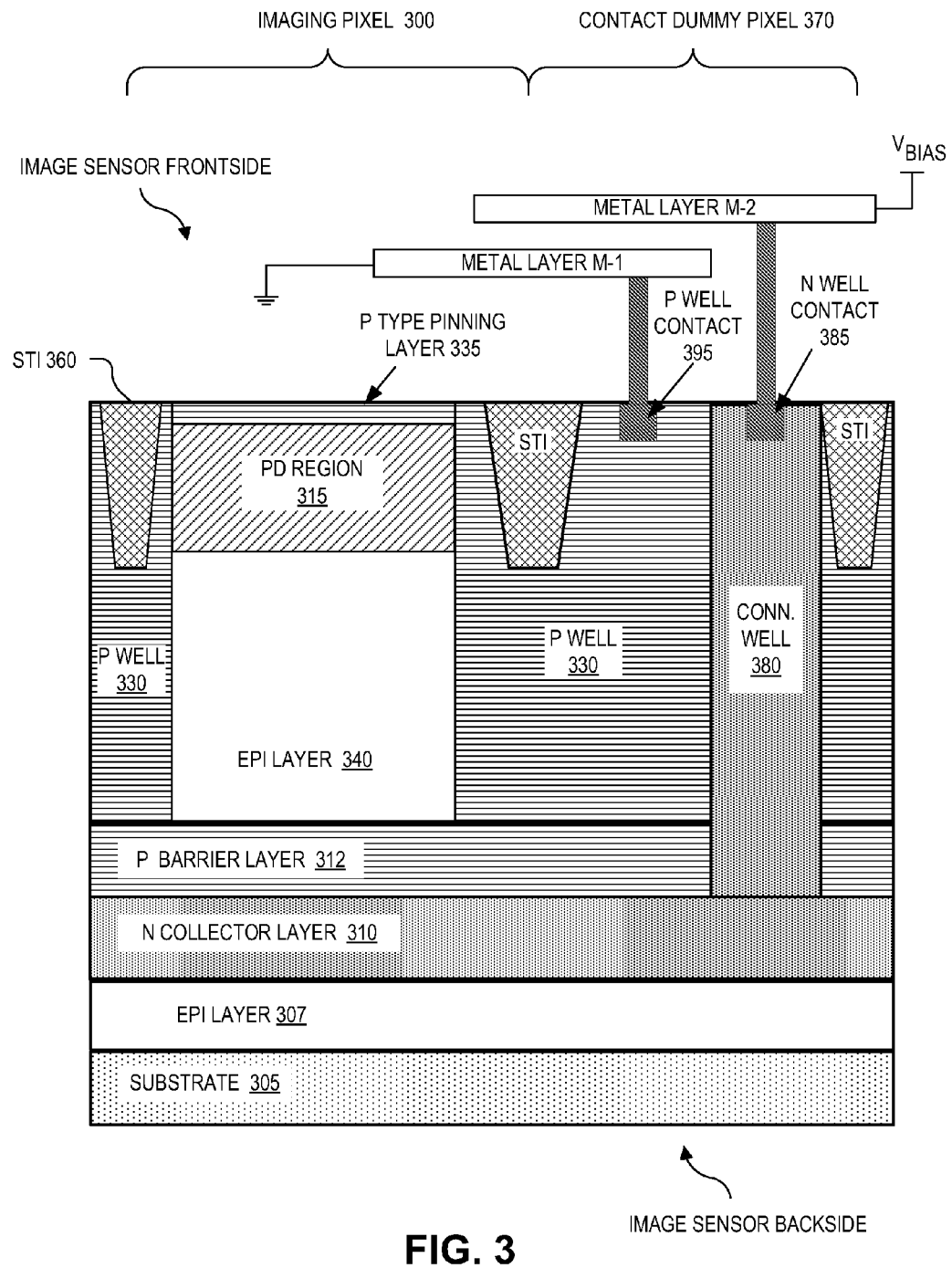
FIG. 3 is a cross sectional view of an imaging pixel neighboring contact dummy pixel, in accordance with an embodiment of the invention.

FIG. 3 illustrates how a contact dummy pixel can be applied to a vertical overflow drain (VOD) structure of a BSI CIS pixel architecture, in accordance with an embodiment of the invention. In the illustrated embodiment, the upper layers (epitaxial layer 340, PD region 315, P wells 330, etc.) are isolated from a bulk p-type substrate 305 by a buried VOD, which includes doped connecting well 380 and collector layer 310. Contact dummy pixel 370 provides an electrical conducting path from the frontside region, through epitaxial layer 240, down to collector layer 310. The illustrated embodiment of imaging pixel 300 includes a substrate 305, an epitaxial ("epi") layer 307, a collector layer 310, a barrier layer 312, an epi layer 340, and a PD region 315. The PD regions 315 of each imaging pixel 300 are isolated from each other with shallow trench isolations ("STI") 360 and P wells 330. In the illustrated embodiment, a p-type doped pinning layer 335 overlays PD regions 315 to passivate their surfaces. Contact dummy pixel 370 includes an doped connecting well 380 (e.g., deep N-well) for making electrical connection between collector layer 310 and above metal interconnect layers (e.g., metal layer M-2) used to conduct charge out of collector layer 310. An n-type doped contact 385 may be present to form a low resistance connection between a metal interconnect layer and doped connecting well 380. Contact dummy pixels 370 may also contain a laterally extended version of dopant well 330 (e.g., wider than corresponding dopant wells separating adjacent imaging pixels) with a p-type doped contact 395 for making electrical contact to a metal interconnect layer (e.g., metal layer M-1). The number and placement of contact dummy pixels 370 may be similar to those for an image sensor array including contact dummy pixels 270 of FIG. 2.

In one embodiment, substrate 305, epitaxial layer 307, barrier layer 312, epitaxial layer 340, doped wells 330, and pinning layer 335 are all p-typed doped (though not necessarily to the same concentration), while collector layer 310, doped connecting well 380, and PD region 315 are n-type doped (though not necessarily to the same concentration. Of course, in other embodiments, the conductivity types may be swapped.

Figure 4:
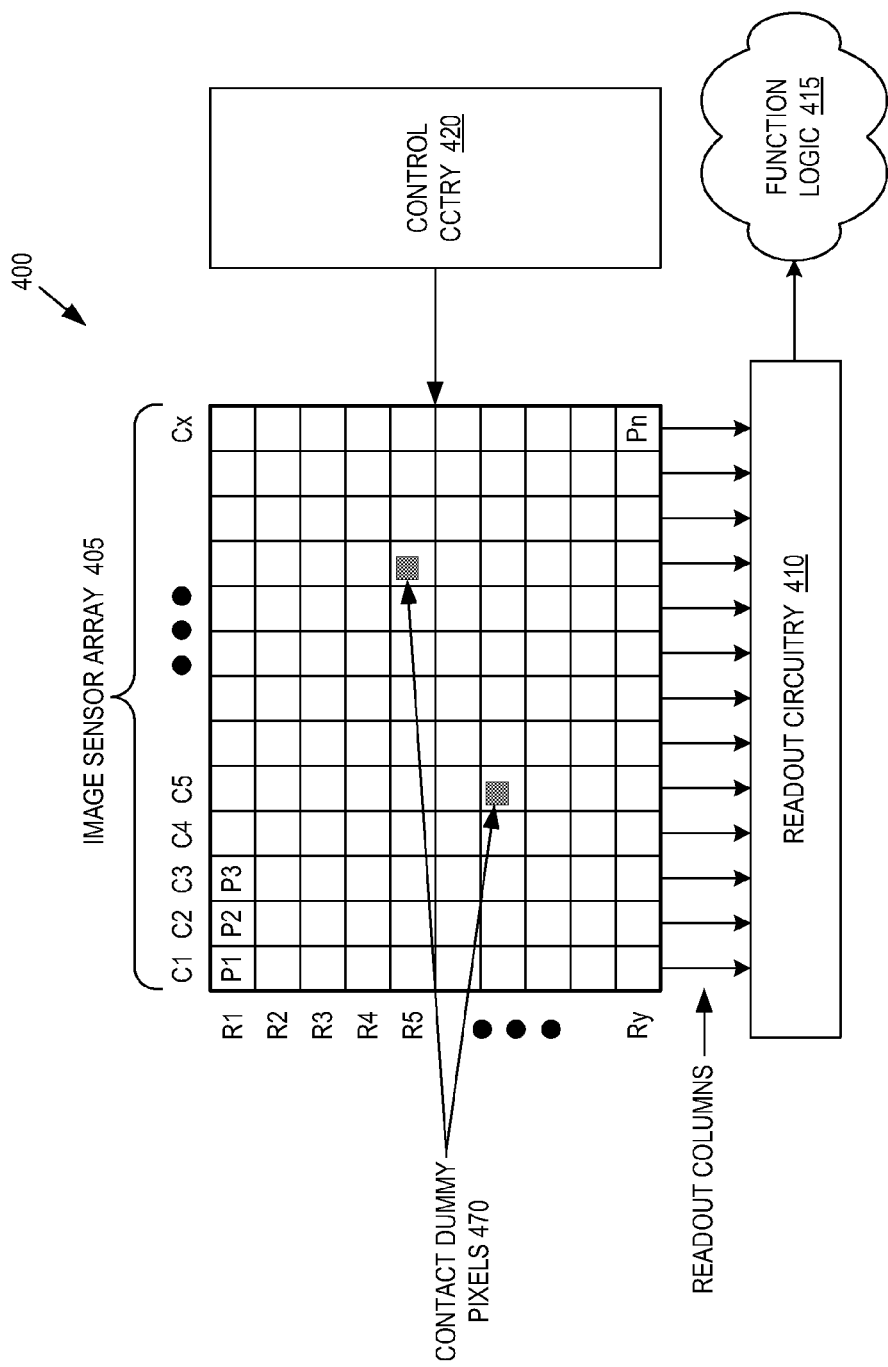
FIG. 4 is a block diagram illustrating an imaging system, in accordance with an embodiment of the invention.

FIG. 4 is a block diagram illustrating an imaging system 400, in accordance with an embodiment of the invention. The illustrated embodiment of imaging system 400 includes an image sensor array 405, readout circuitry 410, function logic 415, and control circuitry 420. Image sensor array 405 is a two-dimensional ("2D") array of imaging pixels (e.g., pixels P1, P2 . . . , Pn) having improved performance characteristics and contact dummy pixels 470. Contact dummy pixels 470 may be implemented with either contact dummy pixels 270 or 370. In one embodiment, image sensor array 405 is a color filter array including a color pattern (e.g., Bayer pattern or mosaic) of red, green, and blue filters. As illustrated, each pixel is arranged into a row (e.g., rows R1 to Ry) and a column (e.g., column Cl to Cx) to acquire image data of a person, place, or object, which can then be used to render a 2D image of the person, place, or object. When contact dummy pixels 470 are implemented as contact dummy pixels 270, substrate grounding is improved and lateral resistance across image sensor array 405 is reduced thereby improving image sensor performance characteristics. When contact dummy pixels 470 are implemented as contact dummy pixels 370, the VOD operates as an anti-blooming structure that reduces overflow induced cross-talk.

During operation, after each imaging pixel has acquired its image data or image charge, the image data is readout by readout circuitry 410 and transferred to function logic 415. Readout circuitry 410 may include amplification circuitry, analog-to-digital ("ADC") conversion circuitry, or otherwise. Function logic 415 may simply store the image data or even manipulate the image data by applying post image effects (e.g., crop, rotate, remove red eye, adjust brightness, adjust contrast, or otherwise). In one embodiment, readout circuitry 410 may readout a row of image data at a time along readout column lines (illustrated) or may readout the image data using a variety of other techniques (not illustrated), such as a column/row readout, a serial readout, or a full parallel readout of all pixels simultaneously. Control circuitry 420 is coupled to image sensor array 405 to control operational characteristic of image sensor array 405. For example, control circuitry 420 may generate a shutter signal for controlling image acquisition. In one embodiment, the shutter signal is a global shutter signal for simultaneously enabling all pixels within image sensor array 405 to simultaneously capture their respective image data during a single acquisition window. In an alternative embodiment, the shutter signal is a rolling shutter signal whereby each row, column, or group of pixels is sequentially enabled during consecutive acquisition windows.

The above description of illustrated embodiments of the invention is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

What is claimed is:

1. An image sensor array, comprising:
    a substrate layer;
    a metal layer disposed above the substrate layer;
    an epitaxial layer disposed between the substrate layer and the metal layer;
    a plurality of imaging pixels disposed within the epitaxial layer each including a photosensitive element for collecting an image signal;
    a contact dummy pixel disposed within the epitaxial layer and including an electrical conducting path through the epitaxial layer, wherein the electrical conducting path couples to the metal layer above the epitaxial layer;
    first doped wells disposed within the epitaxial layer isolating adjacent imaging pixels;
    a second doped well disposed within the epitaxial layer isolating the contact dummy pixel from adjacent ones of the imaging pixels, wherein the second doped well is laterally wider than the first doped wells;
    a shallow trench isolation disposed within the second doped well; and
    a contact disposed within the second doped well and electrically coupled to another metal layer disposed above the epitaxial layer,
    wherein the contact dummy pixel is positioned within the image sensor array amongst the plurality of imaging pixels and does not include a photo-sensor coupled to collect image data,
    wherein the electrical conducting path is separated from the photosensitive elements of the imaging pixels.

2. The image sensor array of claim 1, wherein the electrical conducting path includes a doped connecting well extending through the epitaxial layer.

3. The image sensor array of claim 2, further comprising:
    a collector layer disposed between the substrate layer and the epitaxial layer and extending beneath the imaging pixels and the contact dummy pixel,
    wherein the doped connecting well extends to the collector layer and electrically couples the metal layer to the collector layer to conduct charge carriers away from the imaging pixels.

4. The image sensor array of claim 3, wherein the doped connecting well has an opposite conductivity type as the substrate layer.

5. The image sensor array of claim 4, further comprising:
    a barrier layer disposed between the collector layer and the epitaxial layer, wherein the barrier layer has a same conductivity type as the epitaxial layer.

6. The image sensor array of claim 5, wherein the metal layer is biased to attract electrons from the collector layer and wherein the other metal layer is biased to attract holes from the second doped well.

7. The image sensor array of claim 1, further comprising a plurality of contact dummy pixels are positioned within the image sensor array amongst the plurality of imaging pixels, wherein there are fewer of the contact dummy pixels than of the imaging pixels within the image sensor array.

8. The image sensor array of claim 1, wherein the other metal layer is coupled to a circuit ground.

9. An image sensor, comprising:
    a substrate layer;
    a metal layer disposed above the substrate layer;
    an epitaxial layer disposed between the substrate layer and the metal layer;
    a plurality of imaging pixels disposed within the epitaxial layer each including a photosensitive element for collecting an image signal; and
    a contact dummy pixel disposed within the epitaxial layer and including a doped connecting well extending through the epitaxial layer to the substrate layer, the doped connecting well electrically coupling the metal layer above the epitaxial layer to the substrate layer below the epitaxial layer,
    wherein the contact dummy pixel is positioned within an image sensor array amongst the plurality of imaging pixels and does not include a photo-sensor coupled to collect image data,
    wherein the doped connecting well is separated from the photosensitive elements of the imaging pixels.

10. The image sensor of claim 9, further comprising:
    a doped well disposed within the epitaxial layer and isolating the contact dummy pixel from adjacent ones of the imaging pixels; and
    a shallow trench isolation disposed within the doped well, wherein the doped well does not extend to the substrate layer.

11. The image sensor of claim 9, wherein the metal layer is coupled to a circuit ground to collect and remove holes from the contact dummy pixel.

12. The image sensor of claim 11, further comprising:
    a doped contact region disposed within the contact dummy pixel, the doped contact region having an opposite conductivity type as the doped connecting well; and
    another metal layer disposed above the epitaxial layer, the other metal layer coupled to the doped contact region and biased to attract electrons out of the contact dummy pixel.

13. The image sensor of claim 9, further comprising a plurality of contact dummy pixels disposed within the image sensor array amongst the plurality of imaging pixels to provide a plurality of electrical conducting paths between the metal layer and the substrate layer to reduce resistance across the substrate layer of the image sensor array.

14. An image sensor, comprising:
    a substrate layer;
    a metal layer disposed above the substrate layer;
    an epitaxial layer disposed between the substrate layer and the metal layer;
    a plurality of imaging pixels disposed within the epitaxial layer each including a photosensitive element for collecting an image signal; and
    a contact dummy pixel disposed within the epitaxial layer and including a doped connecting well extending through the epitaxial layer, a collector layer disposed between the substrate layer and the epitaxial layer and extending beneath the imaging pixels and the contact dummy pixel, wherein the doped connecting well extends to the collector layer and electrically couples the metal layer to the collector layer to conduct charge carriers away from the imaging pixels, wherein the contact dummy pixel is positioned within an image sensor array amongst the plurality of imaging pixels and does not include a photo-sensor coupled to collect image data, wherein the doped connecting well is separated from the photosensitive elements of the imaging pixels.

15. The image sensor array of claim 14, further comprising:

a barrier layer disposed between the collector layer and the epitaxial layer, wherein the barrier layer has a same conductivity type as the epitaxial layer.

16. The image sensor array of claim 15, further comprising:

first doped wells disposed within the epitaxial layer isolating adjacent imaging pixels;

a second doped well disposed within the epitaxial layer isolating the contact dummy pixel from adjacent ones of the imaging pixels, wherein the second doped well is laterally wider than the first doped wells;

a shallow trench isolation disposed within the doped well; and a contact disposed within the second doped well and electrically coupled to another metal layer disposed above the epitaxial layer.

17. The image sensor array of claim 16, wherein the metal layer is biased to attract electrons from the collector layer and wherein the other metal layer is biased to attract holes from the second doped well.

* * * * *